(12) United States Patent
Hsiao et al.

(10) Patent No.: US 6,391,705 B1
(45) Date of Patent: May 21, 2002

(54) FABRICATION METHOD OF HIGH-DENSITY SEMICONDUCTOR MEMORY CELL STRUCTURE HAVING A TRENCH

(75) Inventors: Chia-Shun Hsiao; Chao-chueh Wu; Chih-yu Lee, all of Hsinchu (TW)

(73) Assignee: ProMOS Technologies, Inc., Hsinchu (TW)

( * ) Notice: Subject to any disclaimer, the term of this patent is extended or adjusted under 35 U.S.C. 154(b) by 0 days.

(21) Appl. No.: 09/547,481

(22) Filed: Apr. 12, 2000

(51) Int. Cl.⁷ .......................................... H01L 21/8242
(52) U.S. Cl. ...................................... 438/243; 438/246
(58) Field of Search .......................... 438/238, 243–249, 438/381, 386–392

(56) References Cited

U.S. PATENT DOCUMENTS

| | | |
|---|---|---|
| 5,753,947 A | 5/1998 | Gonzalez |
| 6,063,658 A * | 5/2000 | Horak et al. ................ 438/248 |
| 6,225,158 B1 * | 5/2001 | Furukawa et al. .......... 438/243 |

* cited by examiner

*Primary Examiner*—Jey Tsai
(74) *Attorney, Agent, or Firm*—Blakely Sokoloff Taylor & Zafman LLP

(57) ABSTRACT

A high density semiconductor memory device is provided. The memory device includes a transistor and a capacitor formed along the sidewall of a trench. The trench is formed below the crossing of a word line and a bit line. The capacitor is formed by diffusing dopants into the substrate surrounding the lower portion of the trench, depositing an insulating layer, and depositing a conducting layer into the trench. The transistor is formed in the substrate adjacent to the upper sidewall of the trench. The source region is formed by thermal drive-in, and the drain region is formed by ion-implantation. The gate electrode is formed by depositing a conducting material into the trench. A gate contact window connects the gate electrode to the word line, and a drain contact window connects the drain to the bit line. The drain region of two adjacent memory cells are connected, and share the same drain contact window. An isolation layer surrounds the common drain region and the two transistors sharing a drain contact window to prevent signal interference with other transistors.

9 Claims, 19 Drawing Sheets

FABRICATION METHOD OF HIGH-DENSITY SEMICONDUCTOR MEMORY CELL STRUCTURE HAVING A TRENCH

FIELD OF THE INVENTION

This invention relates to a semiconductor device and manufacturing process, and more particularly, to an improved DRAM device utilizing vertically oriented access transistors and its manufacturing method.

BACKGROUND OF THE INVENTION

A semiconductor memory device comprises of millions of memory cells tightly packed in an array on a semiconductor substrate. Each of the memory cells typically includes an access transistor and a storage capacitor, and the cells are accessed using word lines and bit lines. In order to increase the density of the memory cells, the footprint of each memory cell must decrease. One difficulty in reducing the area of a memory cell is that when the surface area of the capacitor storage nodes become too small, the capacitor cannot store a sufficient amount of electric charge to overcome leakage current, resulting in data loss. In the past, various ways have been proposed to pack the transistor and storage capacitor in a very small area. One method is to use stacked crown capacitors, so that the footprint of the capacitor is reduced, while the surface area of the storage nodes of the capacitor remains substantially the same. Another method is to use vertical trench capacitors that bury deep into the substrate, so that the capacitor occupies a small area on the substrate, yet its storage node has enough surface area to retain sufficient electric charge. Typically, a horizontal transistor is coupled to the trench capacitor. Methods have been proposed to stack a vertical transistor on top of the trench capacitor, but the methods for forming such a device has been complex and expensive.

The present invention is directed to an improved DRAM cell having high density that can be manufactured using simple processing steps.

SUMMARY OF THE INVENTION

A vertical-transistor trench-capacitor memory cell and method of making such memory cell is provided. A memory cell includes a transistor and a capacitor formed along the sidewall of a trench that is formed below the crossing of a word line and a bit line. The capacitor is formed in the lower portion of the trench, and the source and drain regions of the transistor are formed in the substrate adjacent to the upper sidewall of the trench. The source is formed by thermal diffusion, and the drain is formed by ion-implantation. The gate electrode is formed within the upper portion of the trench, separated from the capacitor by an insulating layer. The gate electrode is connected to a word line via a gate contact window, and the drain region is connected to a bit line via a drain contact window. The drain region of one memory cell is extended and connects to the drain region of an adjacent memory cell. The two cells share a common drain contact window, and are surrounded by an isolation layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings.

DETAILED DESCRIPTION OF THE PREFERRED EMBODIMENT

Figure 1:
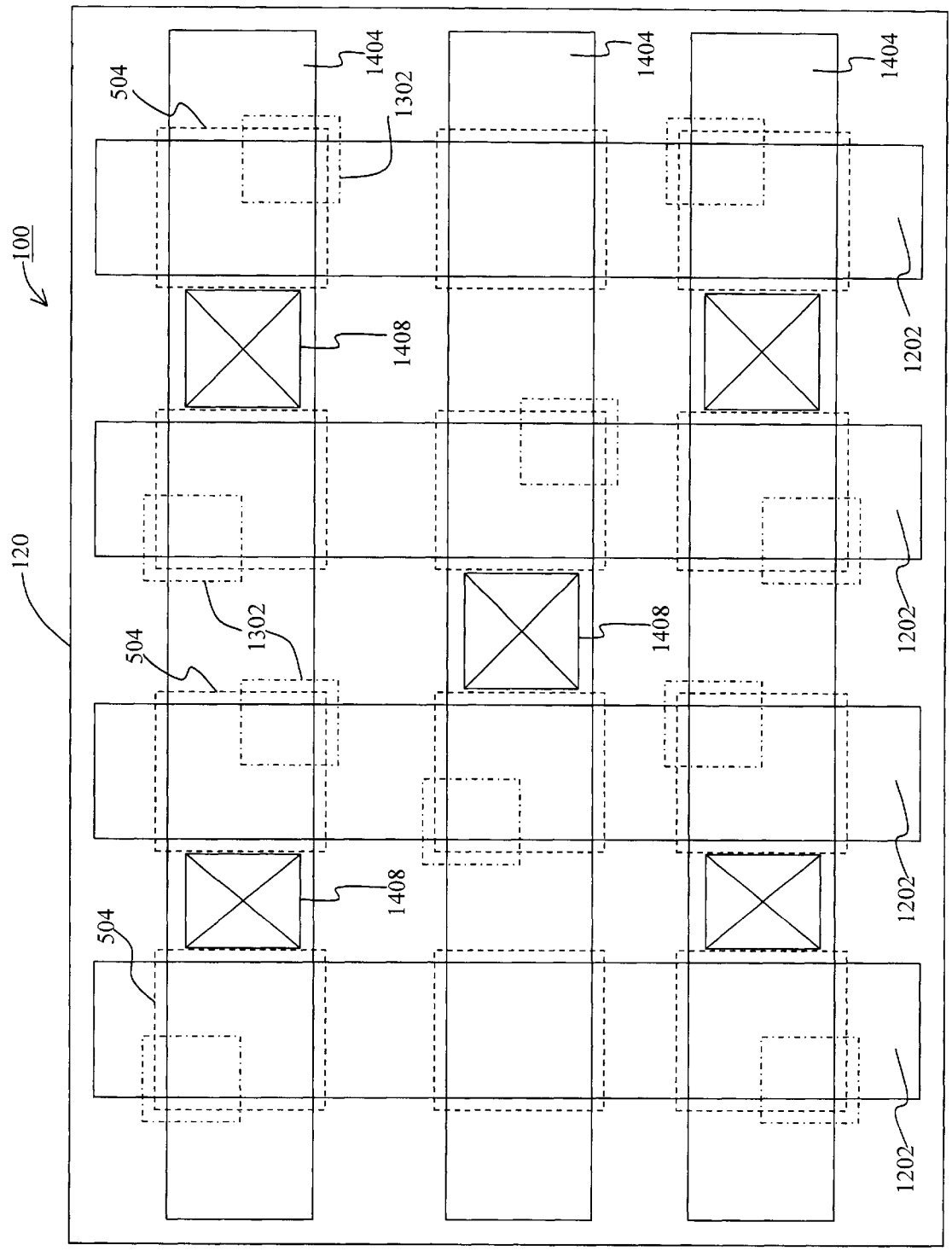
FIG. 1 shows a top view of a semiconductor memory cell array fabricated in accordance with the present invention.

FIG. 1 shows a top view of a memory cell array 100. The cell array 100 is formed in the cell array region 120. The cell array 100 includes word lines 1202 and bit lines 1404 arranged in a cross-array. Capacitors 504 are formed below the intersections (crossings) of the bit lines 1404 and the word lines 1202. Bit line contact windows (drain contact windows) 1408 are formed on the bit lines 1404 to provide access to the drain regions of the memory cells below the bit lines 1404. Gate contact windows 1302 are formed below the word lines 1202 to provide access to the gate electrodes below. For purpose of clearly illustrating certain portions of the device, the dimensions of the devices in the figures hereinafter may not be proportional to their actual dimensions.

Figure 2:
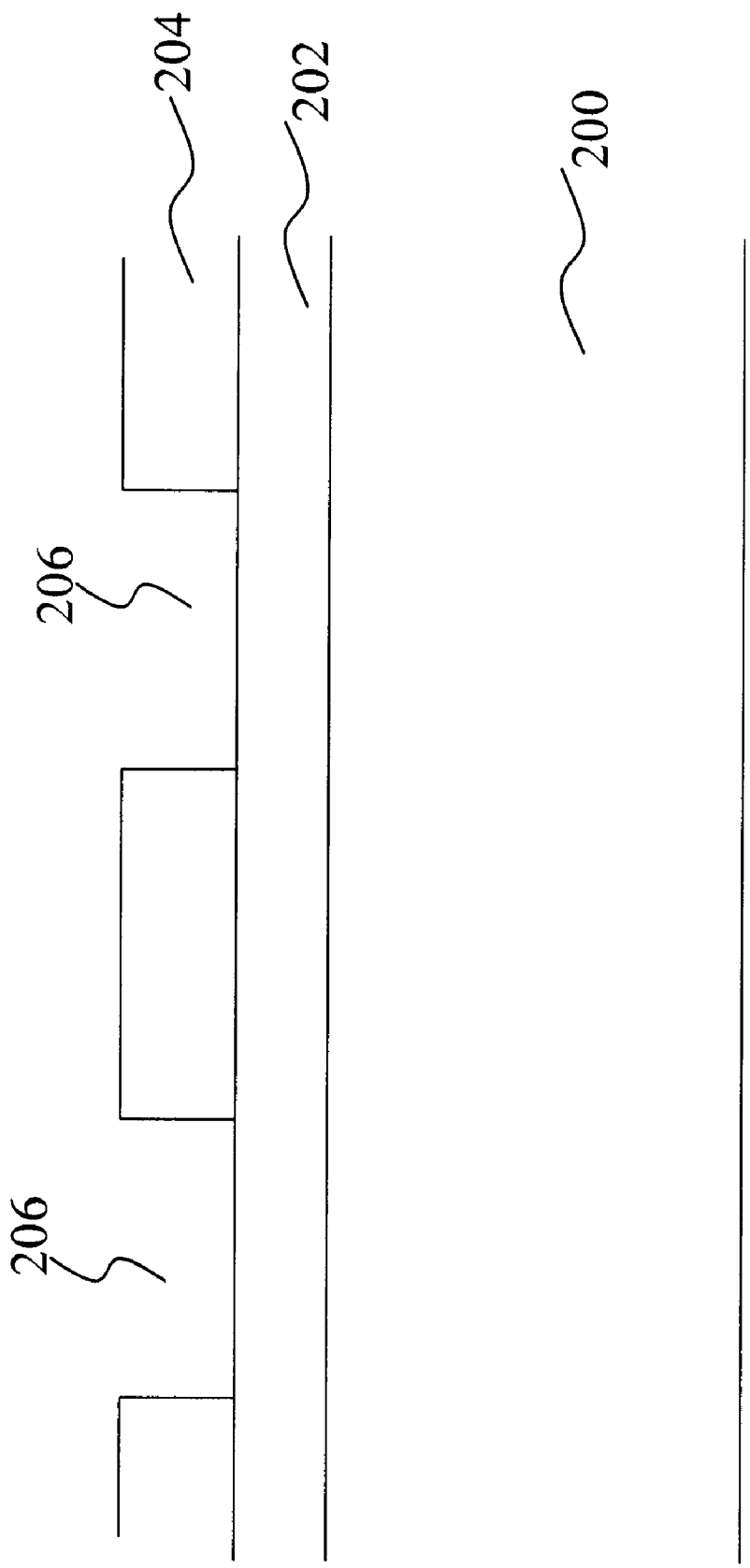
FIGS. 2 to 9 and 10A, 11A, 12A, 13A, and 14A show the cross sectional views of a semiconductor wafer at successive stages of the processing stage.

Referring to FIG. 2, a pad oxide 202 is first grown on a semiconductor substrate 200, preferably, a P-type substrate. A hard mask layer 204 is deposited on top of the pad oxide 202. The hard mask layer 204 is preferably composed of silicon nitride, and may be deposited on the pad oxide 202 using chemical vapor deposition. The pad oxide layer 202 reduces the stress between the hard mask layer 204 and the substrate 200. An opening 206 is formed in the hard mask layer 204. A photoresist (not shown in the figure) is applied in a photolithography masking process, and a dry anisotropic etch is performed to produce the opening 206 in the hard mask layer 204. Preferably, a plasma etching process is used for the dry anisotropic etch.

Figure 3:
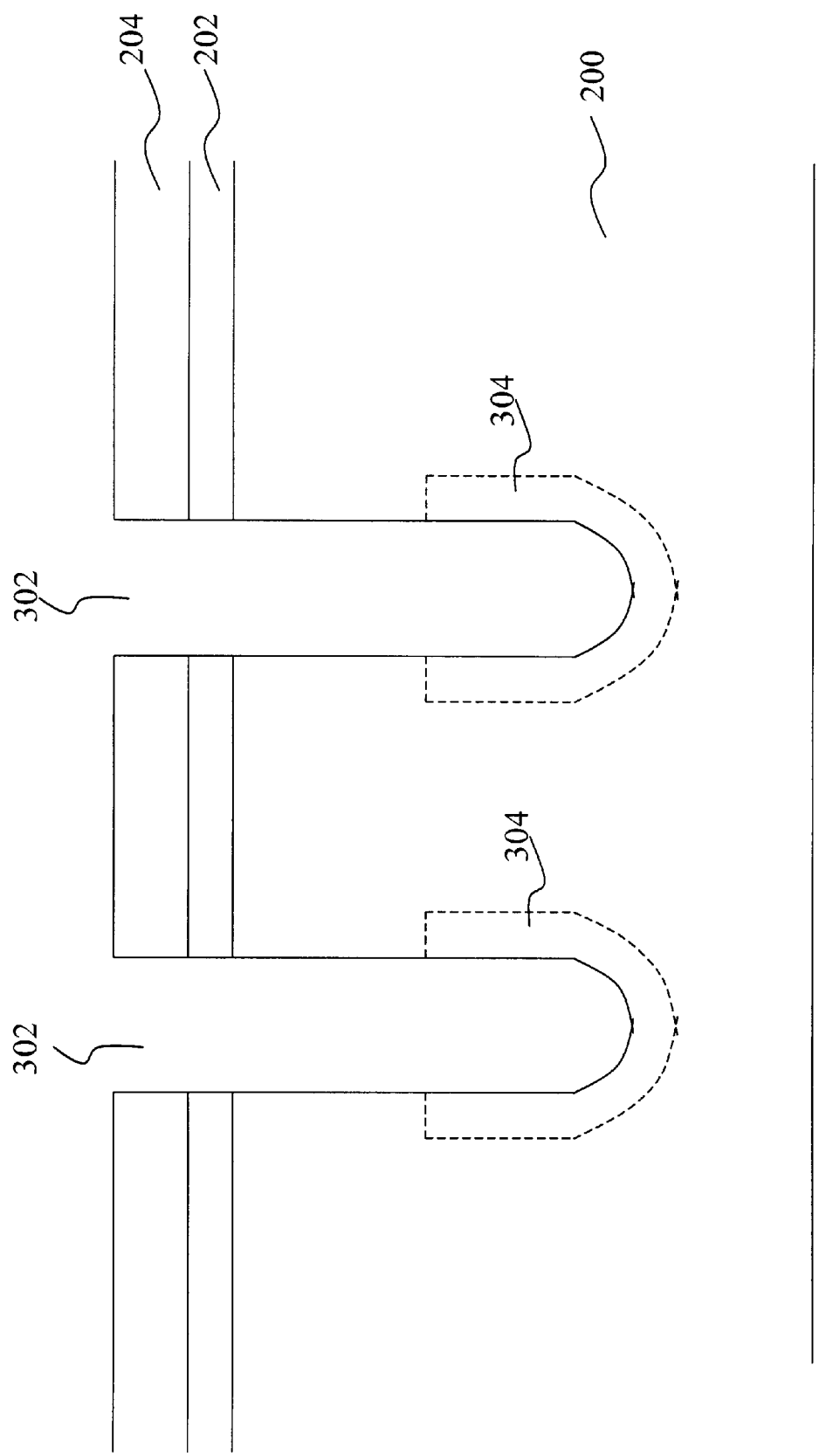

Referring to FIG. 3, a dry anisotropic etch is applied to produce the trench 302 with vertical sidewalls. Alternatively, the trench 302 may be formed into a bottle shape using other processing steps. Preferably, the width of the trench 302 may be 0.2 m, and its depth may be 8 m. Next, an impurity region is formed on the lower sidewall of the trench 302. Preferably, a dopant oxide layer (an oxide layer containing N+ dopants such as arsenic or phosphorus) is formed on the lower sidewall of the trench 302 (the lower sidewall will refer to both the vertical sidewall of the lower portion of the trench 302 and the bottom floor of the trench 302). This is achieved by depositing the dopant oxide layer into the trench 302, followed by depositing a photoresist layer on top of the dopant oxide layer. Using plasma etch, the photoresist layer is reduced to a predetermined height that is about the mid-height of the trench 302. The portion of the dopant oxide layer not covered by the photoresist layer is then removed. The photoresist layer is also removed. Thus the dopant oxide layer will cover only the lower sidewall of the trench 302.

A protective oxide layer is next formed on the sidewalls of the trench 302. A thermal drive-in process is subsequently performed to diffuse the N+ dopants in the dopant oxide layer into the substrate 200 surrounding the lower sidewall of the trench 302, thus forming the impurity region. The protective oxide layer confines the impurity region to surround the lower half of the trench 302 by preventing the dopants from laterally diffusing through the upper sidewall of the trench 302. The impurity region becomes a lower storage node 304 of a capacitor 504 (see FIG. 5). The dopant oxide layer is then removed, preferably through a wet etching process. Preferably, the dopant oxide layer is composed of ASG (Arsenic Silicate Glass). Preferaly, a concentration of $10^{20}$ atoms/cc for the N+ dopants may be used, and the thermal drive-in is conducted at a temperature of 1050° C.

Figure 4:
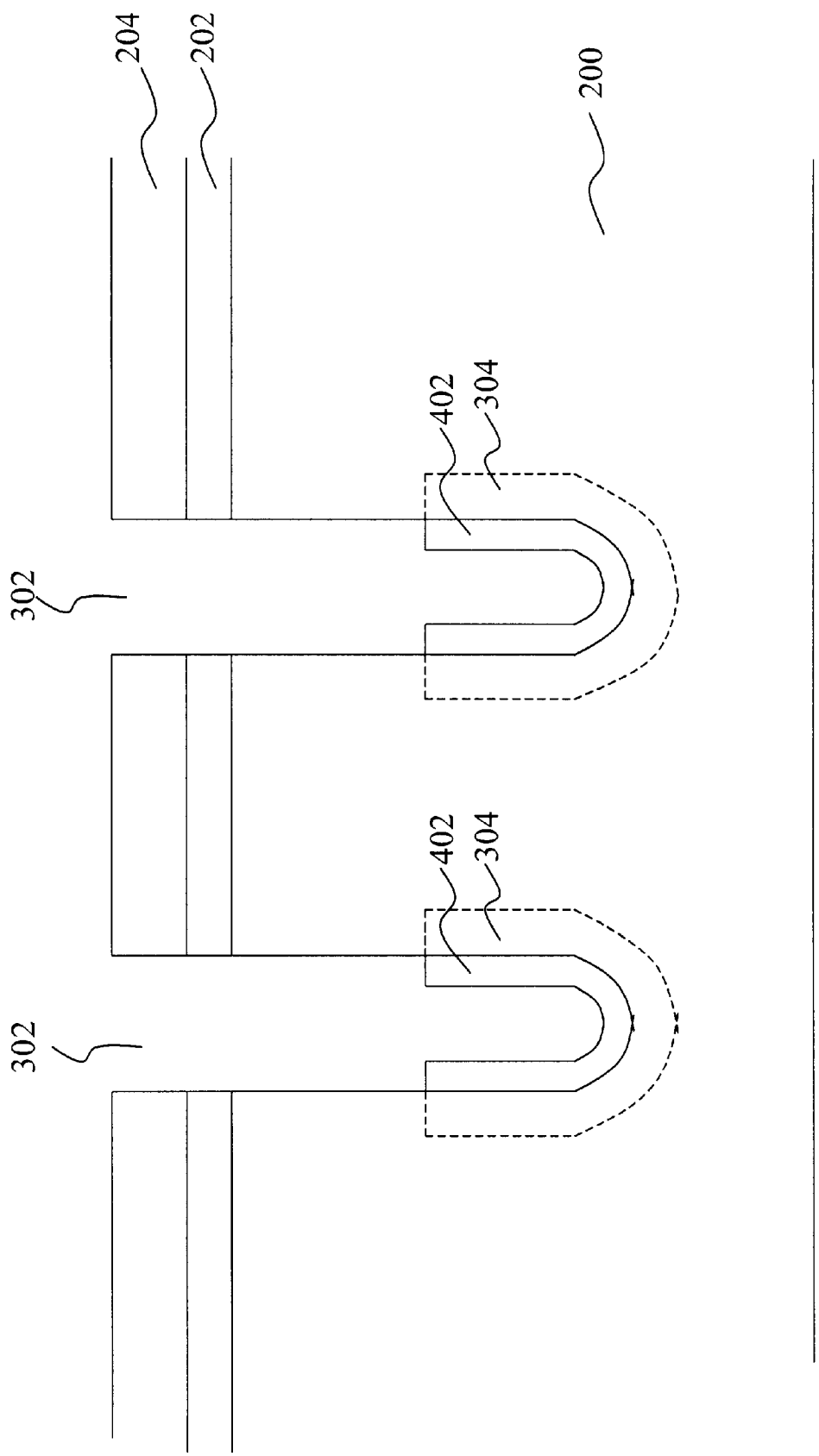

Referring to FIG. 4, a capacitor dielectric layer 402 is formed on the lower sidewall of the trench 302. The capacitor dielectric layer 402 is formed by first depositing a layer of dielectric material on the sidewall of the trench 302 and atop the hard mask layer 204. A dry anisotropic etch is then preformed to remove the dielectric material above the hard mask layer 204, and to reduce the height of the dielectric material within the trench 302 so that it only covers the lower sidewall of the trench 302 adjacent to the lower storage node 304. Preferably, the capacitor dielectric layer 402 is composed of silicon oxide and silicon nitride (NO), or ONO. In making the NO dielectric layer, the silicon nitride layer (N) is formed by low-pressure chemical vapor deposition (LPCVD) to give a thickness of about 40 Å. The top silicon oxide (O) layer may be formed under a thermal oxidation process. Preferably, the thickness of the NO layer is about 80 Å.

Figure 5:
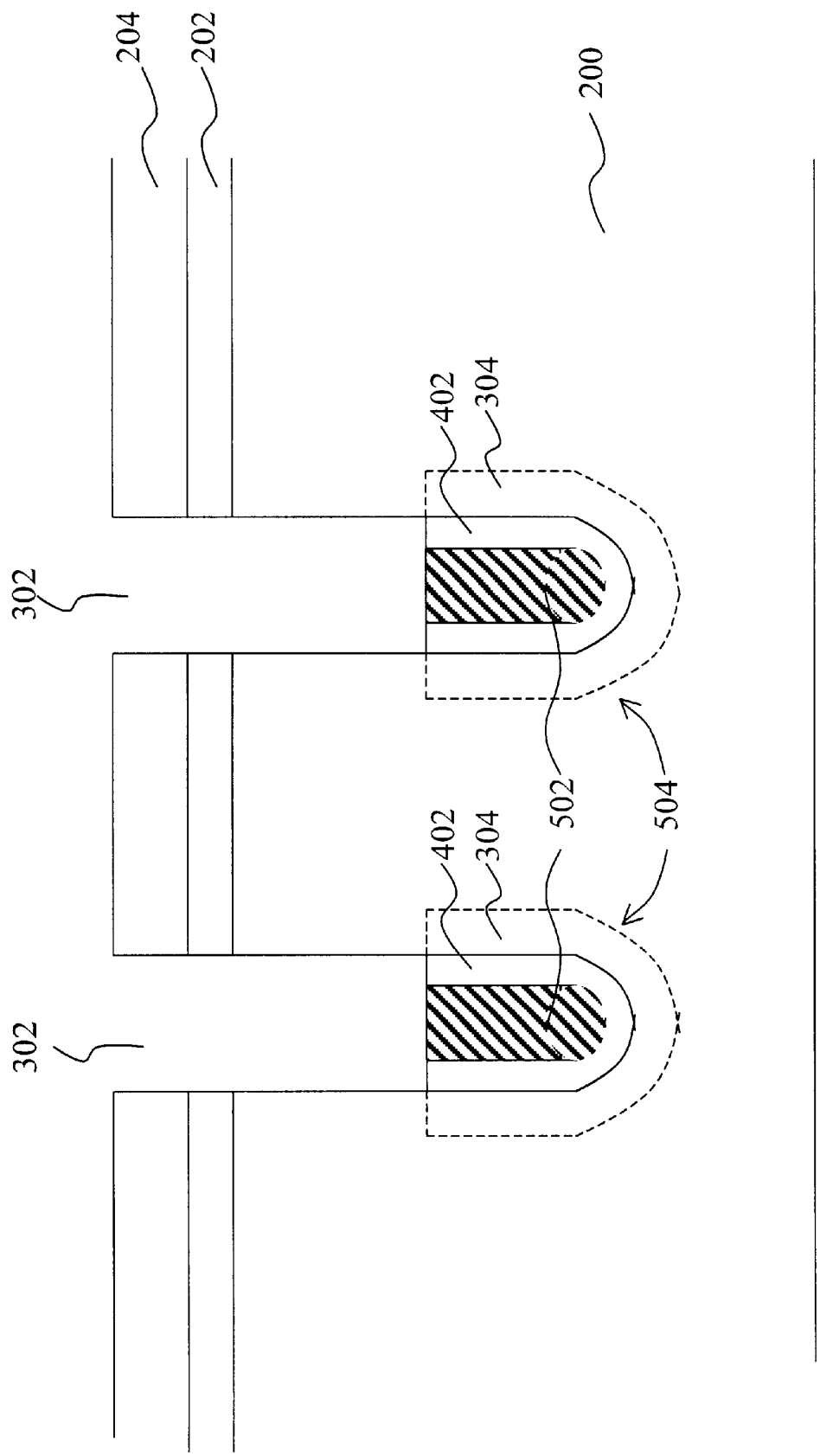

Referring to FIG. 5, a capacitor 504 is completed by forming an upper storage node 502 in the lower portion of the trench 302 surrounded by the capacitor dielectric layer 402. The upper storage node 502 is formed by first depositing a layer of conducting material atop the hard mask layer 204 and filling into the trench 302. Preferably, the conducting material is composed of polysilicon, and is deposited using chemical vapor deposition. Next, the conducting material above the hard mask layer 204 is removed, preferably using a chemical-mechanical polishing. The conducting material inside the trench 302 is then etched-back to the same height as the capacitor dielectric layer 402. Hereinafter, the portion of the sidewall of the trench 302 that is above the capacitor 504 is referred to as the upper sidewall.

Figure 6:
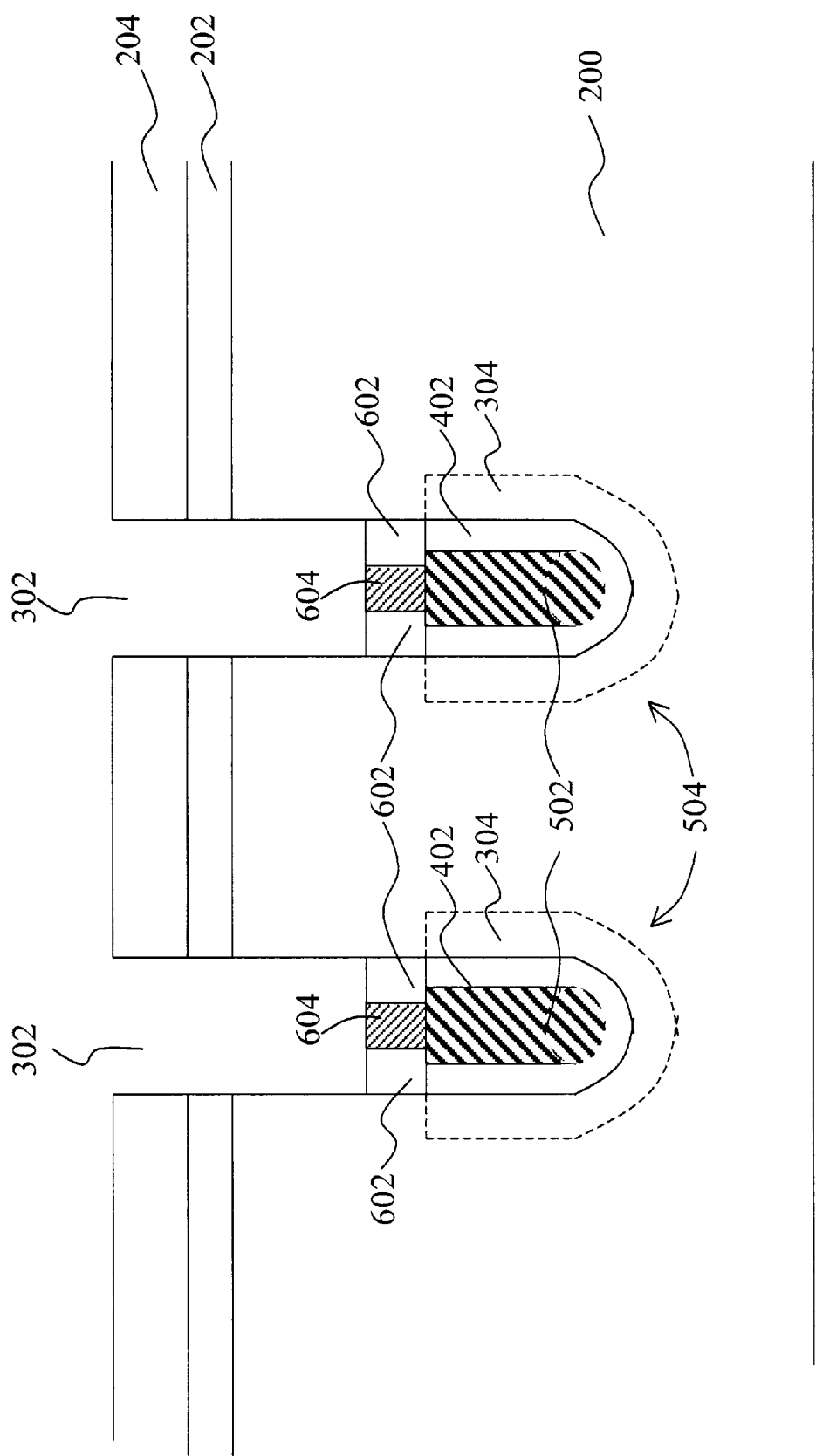

Referring to FIG. 6, a collar insulating layer 602 is formed on the sidewall of the trench 302 above the dielectric layer 402. The collar insulating layer 602 is formed by first depositing an oxide layer on the upper sidewall of the trench 302, atop the upper storage node 502, and atop the hard mask layer 204. The oxide layer is preferably formed using chemical vapor deposition. Next, anisotropic etching is used to remove the oxide layer above the hard mask layer 204. The anisotropic etch also removes the oxide layer on the exposed surface of the upper storage node 502. A collar insulating layer 602 is thus formed on the lower portion of the upper sidewall of the trench 302. Preferably, the collar insulating layer 602 has a thickness of 30 nm and a vertical height of 1 m.

Next, still referring to FIG. 6, a storage node connector 604 is formed in the trench 302 above the upper storage node 502. Preferably, the storage node connector 604 is formed by first depositing a polysilicon layer atop the hard mask layer 204 and filling into the trench 302. A chemical-mechanical polishing is used to remove the polysilicon layer above the hard mask layer 204. Then an etch-back is applied to reduce the polysilicon layer inside the trench, preferably to about the same height as the upper edge of the collar insulating layer 602.

Figure 7:
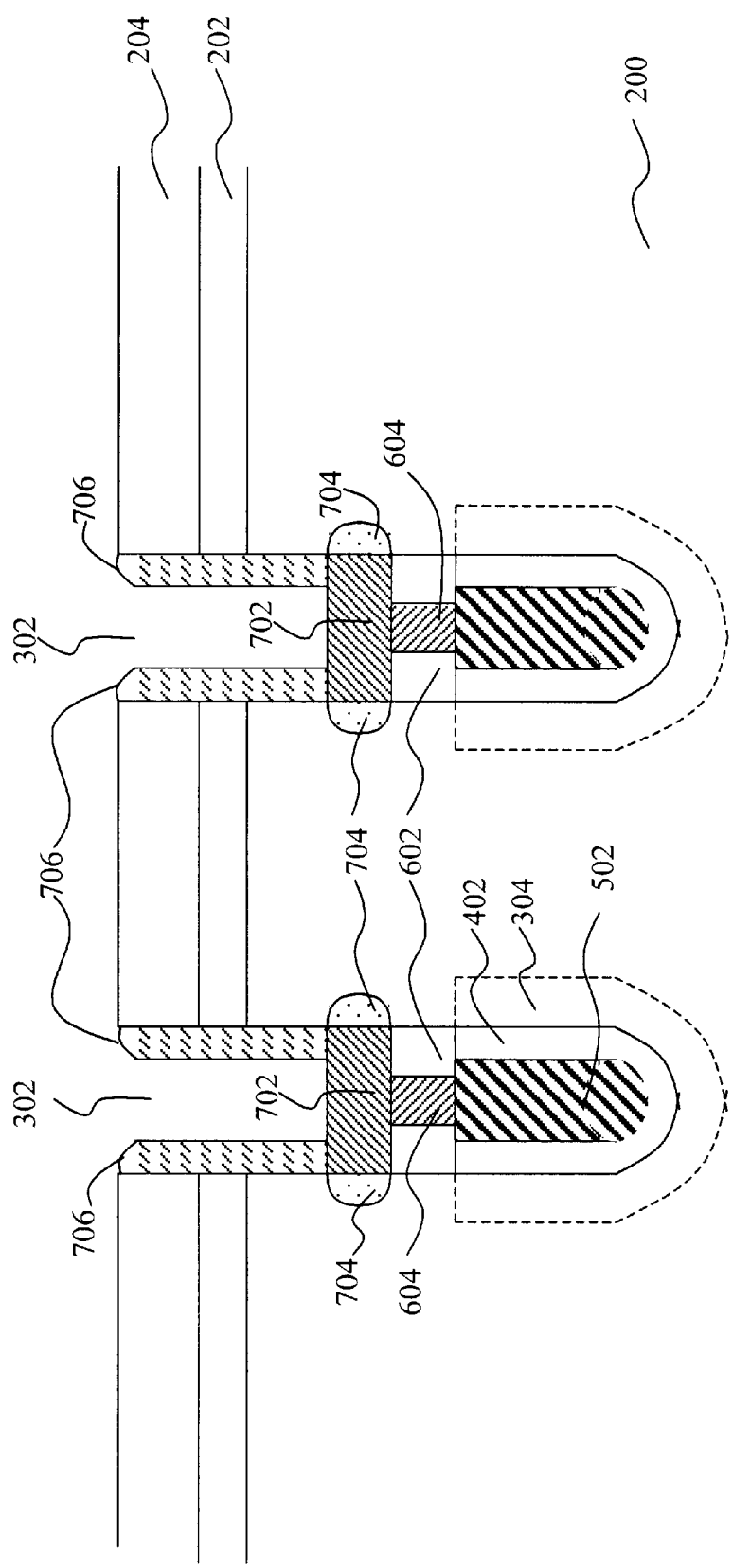

Referring to FIG. 7, a first polysilicon layer 702 is formed atop the storage node connector 604. The first polysilicon layer 702 is formed by depositing a layer of polysilicon atop the hard mask layer, and filling into the trench 302. Within the trench 302, the polysilicon layer 702 covers the top portion of the collar insulating layer 602 and the storage node connector 604. Next, the polysilicon layer above the hard mask layer 204 is removed, preferably by a chemical-mechanical polishing. This is followed by a recessing process to reduce the height of the polysilicon layer in the trench 302 to a predetermined level that is lower than the pad oxide layer 202. Preferably, the first polysilicon layer 702 has a thickness of 500 Å. In an alternative embodiment, a different conducting material may be substituted for polysilicon in the first polysilicon layer 702.

Next, a source region 704 is formed in the substrate 200 in the outer perimeter of the upper sidewall adjacent to the first polysilicon layer 702. Preferably, the source region 704 is formed by doping the first polysilicon layer 702 with dopants using ion implantation. Preferably, P+ (phosphorus ions) or As+ (arsenic ions) may be used as dopants. Next, a thermal drive-in process diffuses the dopants in the first polysilicon layer 702 through the upper sidewall and into the adjacent substrate 200, forming the source region 704. Thus the source region 704 is formed in the substrate 200 proximate to the outer perimeter of the upper sidewall of the trench 302. In an alternative embodiment, this thermal drive-in process may be omitted, and the dopants are diffused into the substrate 200 in subsequent thermal processes for growing oxides.

Next, still referring to FIG. 7, a cover layer 706 is formed on the upper sidewall of the trench 302 above the first polysilicon layer 702. Preferably, a silicon nitride layer is deposited atop the hard mask layer 204 and filling into the trench 302 using chemical vapor deposition. An etch-back process is used to remove the silicon nitride layer above the hard mask layer 204 and on top of the first polysilicon layer 702, exposing the upper surface of the polysilicon layer 702. Typically, a thin pad oxide is formed on the upper sidewall prior to forming the cover layer 706 to reduce the stress between the substrate 200 and the cover layer 706. The cover layer 706 protects the sidewall of the trench 302 from the oxidation processes described below. Preferably, the cover layer 706 may have a thickness of 200 Å.

Figure 8:
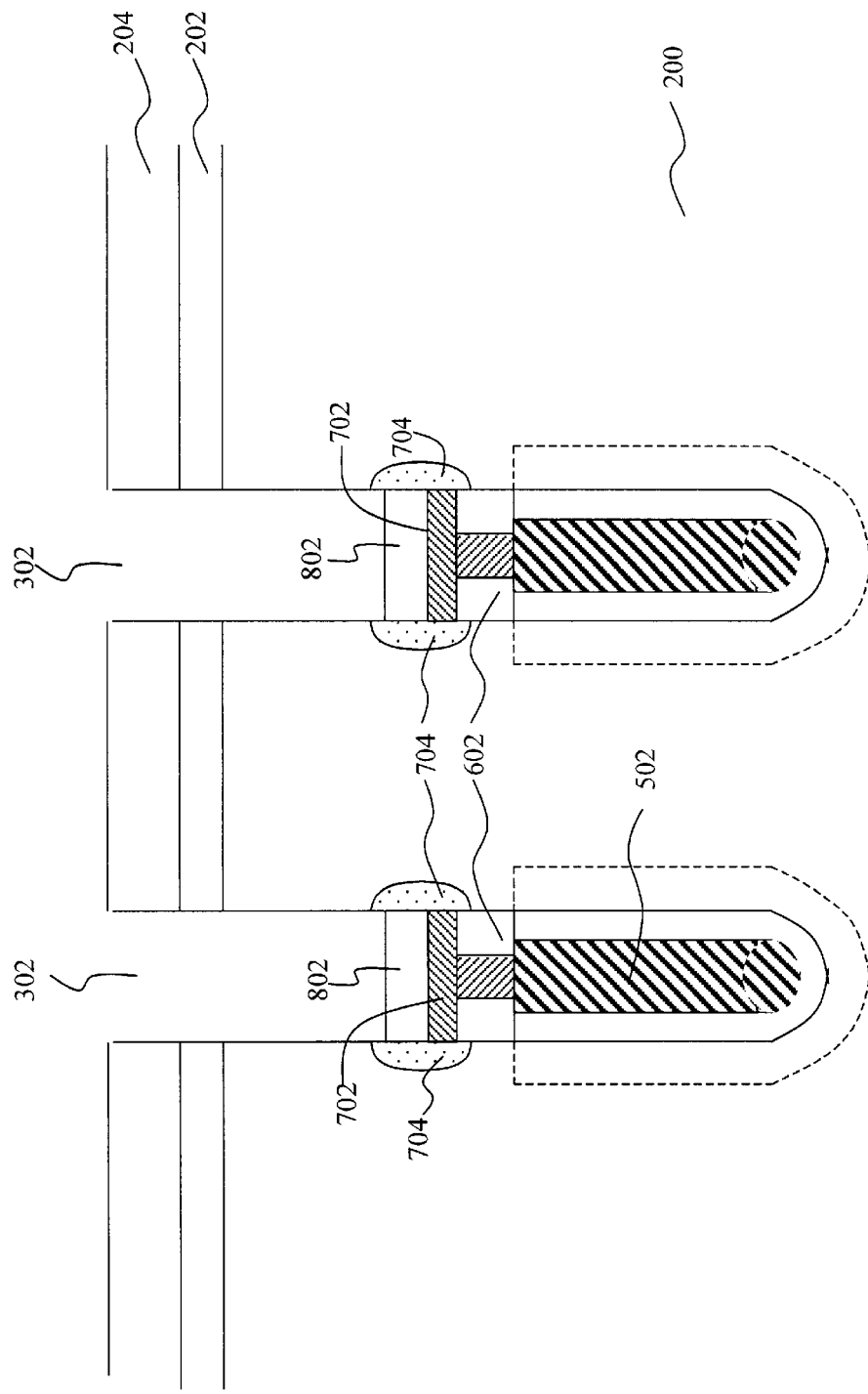
Figure 10:
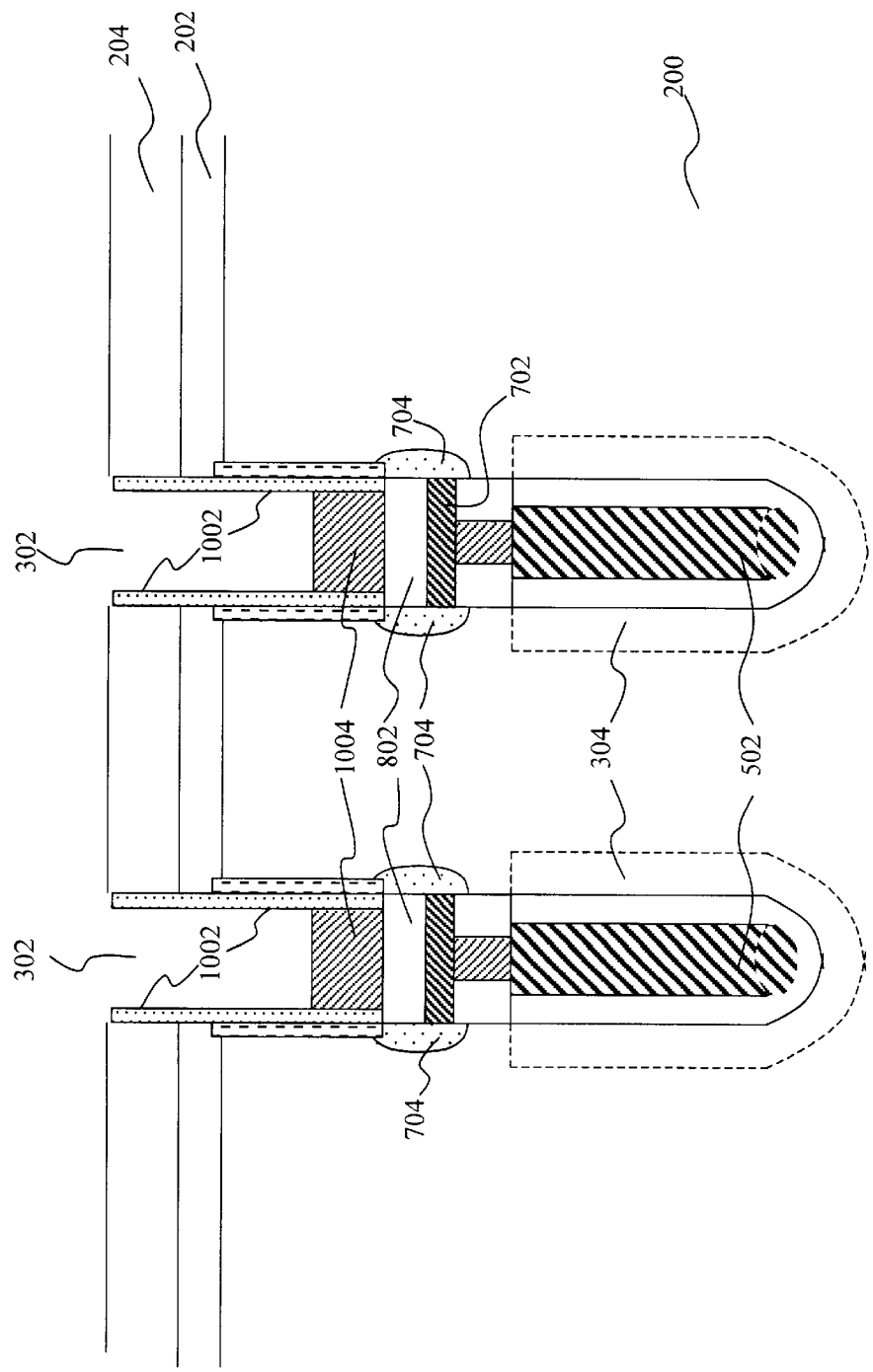
FIGS. 10B, 11B, 12B, 13B, and 14B show the corresponding top views of the semiconductor wafer at the processing stages shown in FIGS. 10A to 14A.
Figure 10:
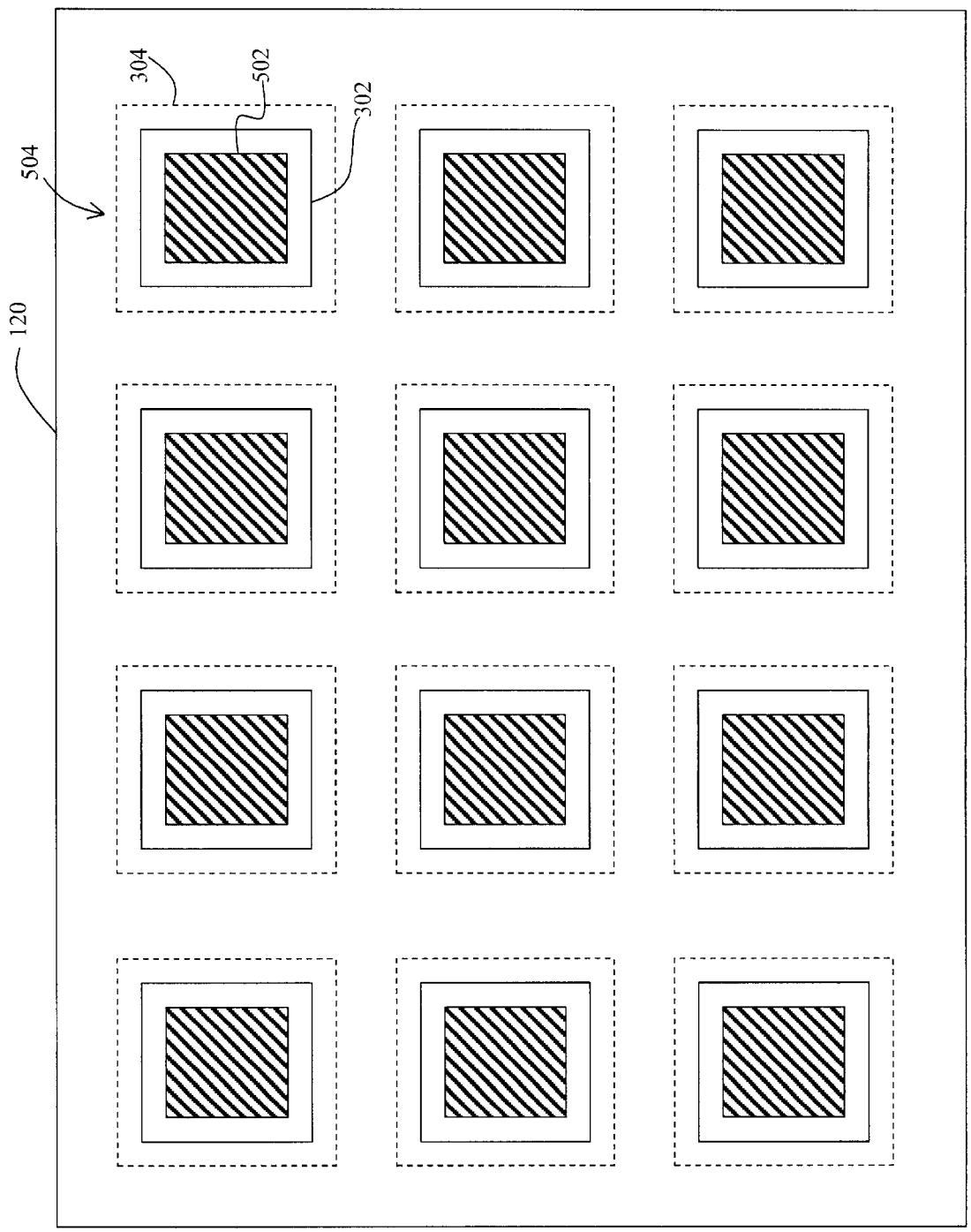

Referring to FIG. 8, a first oxide layer 802 is formed atop the first polysilicon layer 702. Preferably, the first oxide layer 802 is formed by heating the wafer in a oxidization furnace. The upper portion of the first polysilicon layer 702 is oxidized and becomes the fist oxide layer 802. Preferably, the first oxide layer 802 has a thickness of 800 Å. During the thermal process, the dopants implanted in the first polysilicon layer 702 are diffused further into the substrate 200, enlarging the source region 704. The first oxide layer 802 insulates a gate electrode 1004 (see FIG. 10) from the source region 704. The first oxide layer 802 also insulates the gate electrode 1004 from the first polysilicon layer 702 that is connected to the upper storage node 502. The cover layer 706 prevents the upper sidewall of the trench 302 above the first polysilicon layer 702 from being oxidized. After the first oxide layer 802 is formed, the cover layer 706 is removed using a wet etching process.

Figure 9:
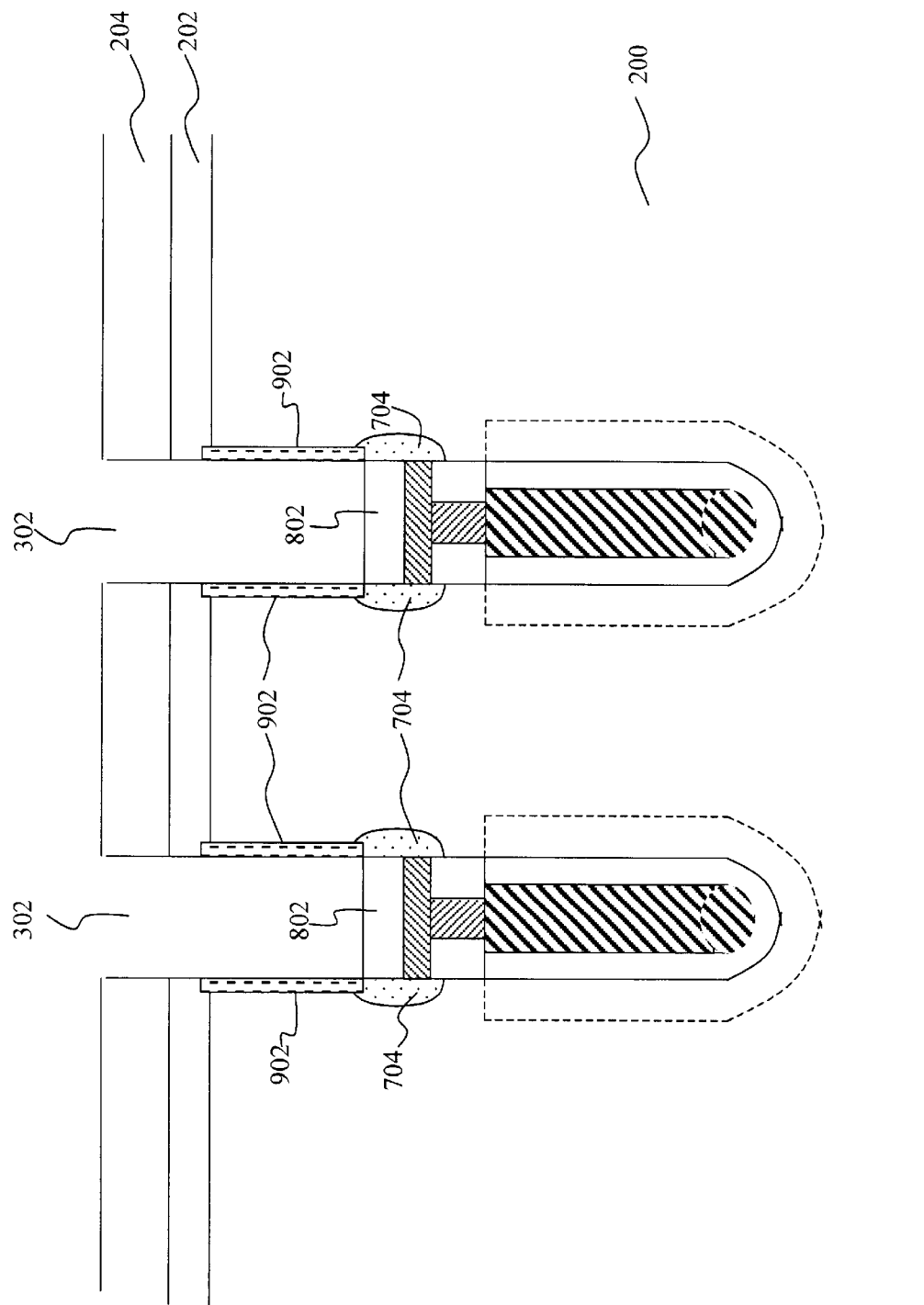

Referring to FIG. 9, a channel implant region 902 is formed in the substrate 200 along the upper sidewall of the trench 302 above the source region 704. This is used to adjust the threshold voltage of the transistor 1214 (see FIG. 12A). First, a sacrificial oxide layer (not shown in the figure) is formed on the upper sidewall of the trench 302. Next, dopants are implanted on the upper sidewall of the trench 302. Preferably, a directional ion implantation is used to implant P− dopants on the upper sidewall of the trench 302, with the implant direction being about 15 to 45 degrees relative to the vertical axis. The implant angle is selected so that the dopants can enter the opening of the trench 302 and reach the upper sidewall of the trench 302. Preferably, the P− dopants may be B+ (boron ions), and the depth of the channel implant region 902 may range between 0 to 100 Å. After the channel implant region 902 is formed, the sacrificial oxide layer is removed.

Referring to FIG. 10A, a gate oxide 1002 is formed on the upper sidewall of the trench 302 above the first oxide layer 802. Preferably, the gate oxide 1002 is grown using a thermal process to convert the silicon substrate adjacent to the upper sidewall of the trench 302 into a thin layer of silicon oxide. The gate oxide 1002 provides insulation between the gate electrode 1004 and the source region 704. The gate oxide 1002 also provides insulation between the gate electrode 1004 and the drain region 1210 (see FIG. 12A). Preferably, the gate oxide has a thickness of 65 Å.

Next, a gate electrode 1004 is formed in the upper portion of the trench 302 above the first oxide layer 802. Preferably, the gate electrode 1004 is formed by first depositing a polysilicon layer into the trench 302 and above the hard mask layer 204. Then a chemical-mechanical polishing and a recessing process is used remove the polysilicon above the hard mask layer 204 and to reduce the polysilicon layer down to a predetermined level that is lower than the pad oxide layer 202. Preferably, the vertical thickness of the gate electrode 1004 may be 3500 Å. The gate oxide 1002 insulates the gate electrode 1004 from the substrate 200 and the source region 704. The first oxide layer 802 insulates the gate electrode 1004 from the first polysilicon layer 702.

FIG. 10B is a top view of the wafer shown in FIG. 10A. The smaller square filled with slanted lines represents the upper storage node 502 of the capacitor 504. The solid square represents the sidewall of the trench 302. The larger dotted line square represents the outer diffusion boundary of the lower storage node 304 of the capacitor 504. The gate electrode 1004 and the source region 704 are situated above the capacitor 504.

Figure 11:
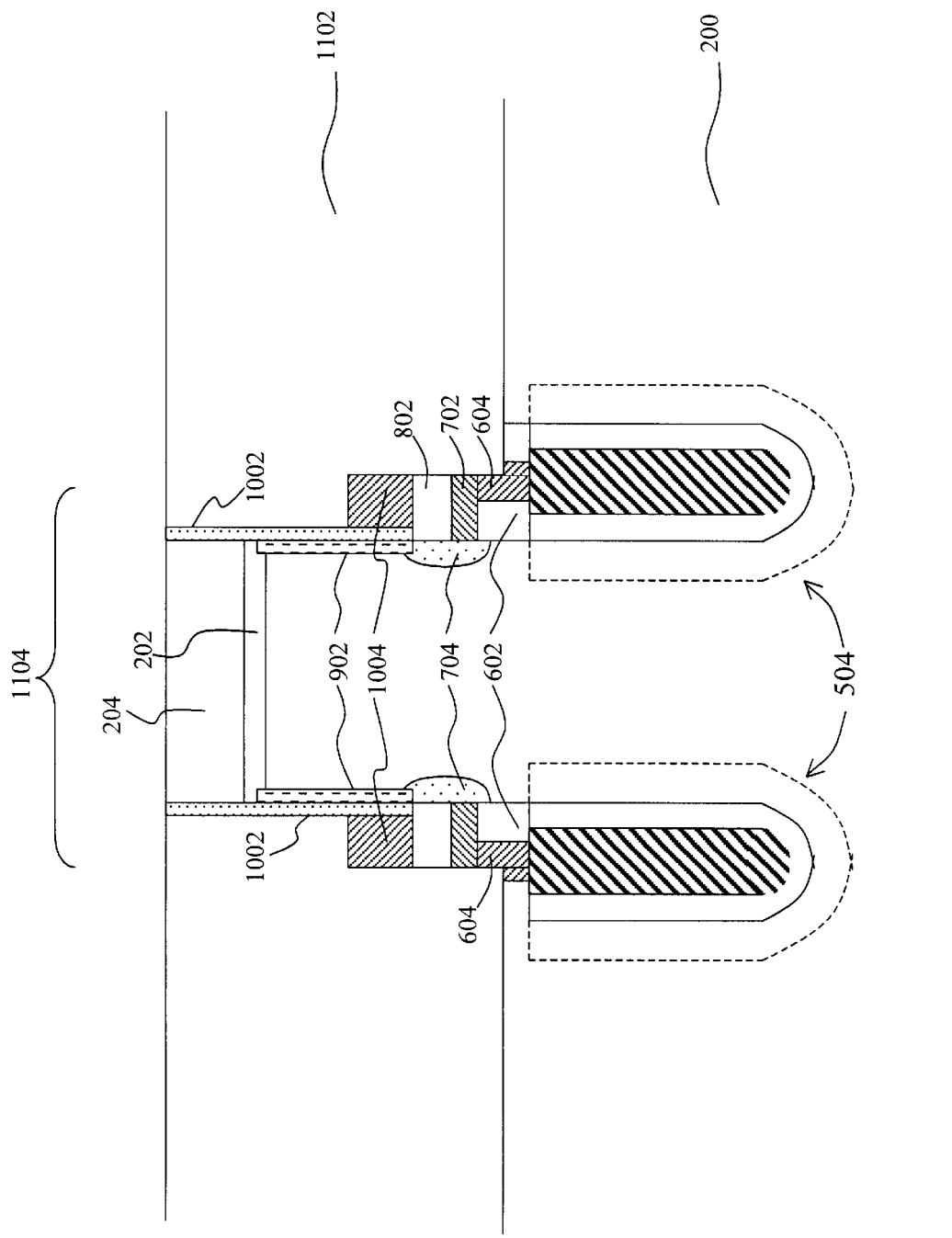

Referring to FIG. 11A, an isolation layer 1102 is formed around pairs of trenches 304. The isolation layer 1102 surrounds an active region 1104 in which a common drain region 1210 (see FIG. 12A) is formed. The isolation layer 1102 also isolates a word line 1202 (see FIG. 12A) from the underlying transistor 1214 (see FIG. 12A) and capacitor 504. To form the isolation layer 1102, a photolithography process is used to form an etching mask to protect the active region 1104. The parts not protected by the etching mask are etched away, preferably using a dry etch (plasma etch) process. Part of the substrate 200, part of the gate oxide 1002, part of the channel implant region 902 that are not proximate to the active region 1104 are etched away. Also, part of the gate electrode 1004, part of the first oxide layer 802, part of the first polysilicon layer 702, part of the storage node connector 604, and part of the collar insulating layer 602 that are not proximate to the active region 1104 are etched away. Preferably, the etching process etches to a level that is below the first. polysilicon layer 702 but above the top end of the capacitor 504. Preferably, the isolation layer 1102 is formed by depositing an oxide layer over the whole cell array region 120. A chemical-mechanical polishing and a recessing process is applied to the oxide layer to reduce the oxide layer to the about the same level as the upper surface of the hard mask layer 204. After the etching process is completed, the active region 1104 becomes surrounded by the isolation layer 1102.

Figure 11B:
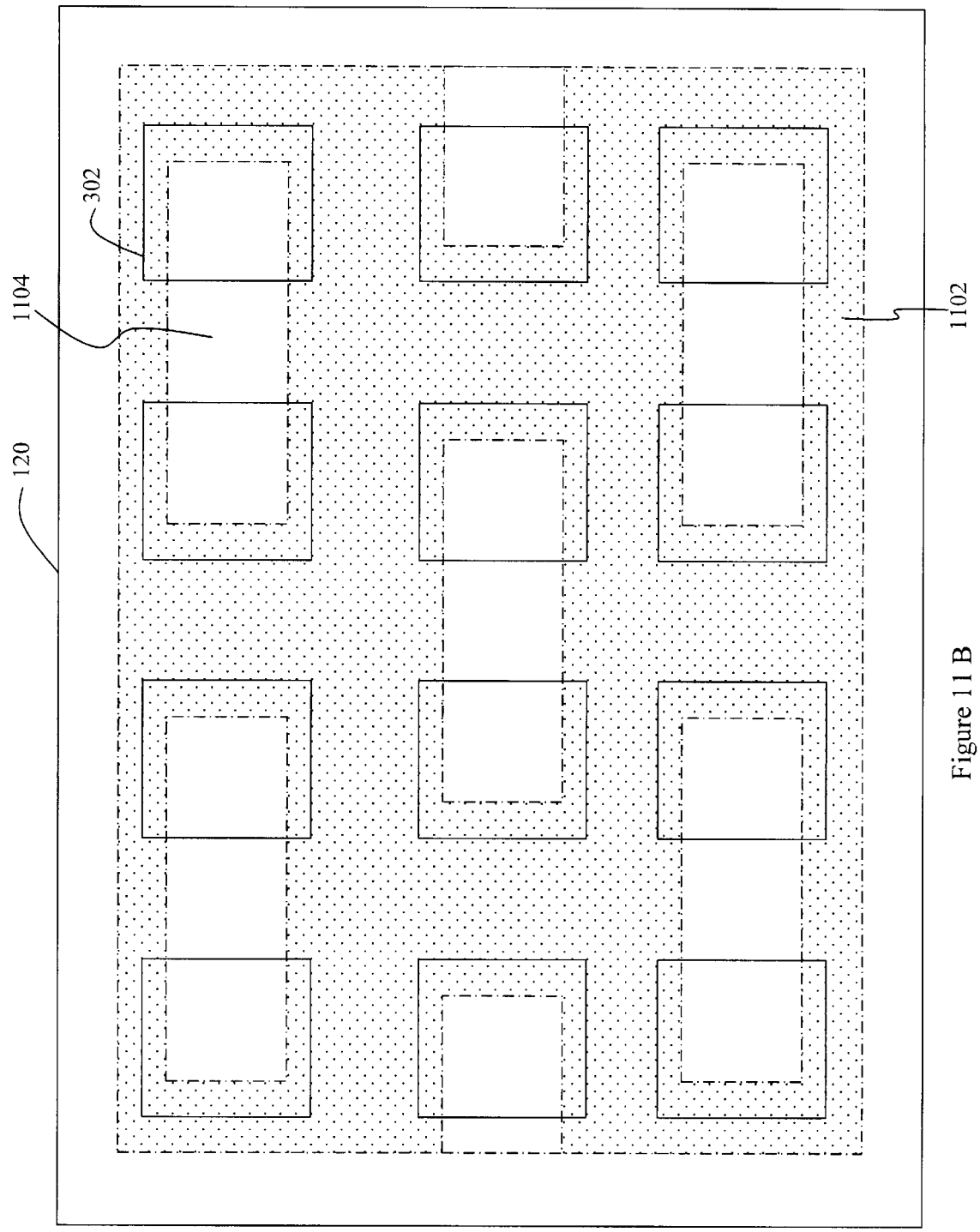

Shown in FIG. 11B is a top view of the cell array area 120 after the isolation layer 1102 is formed. The filled dotted area represents the region covered by the isolation layer 1102. The active region 1104 is surrounded by the isolation area 1102. Part of the trench 302 is filled by the isolation layer 1102.

Figure 12:
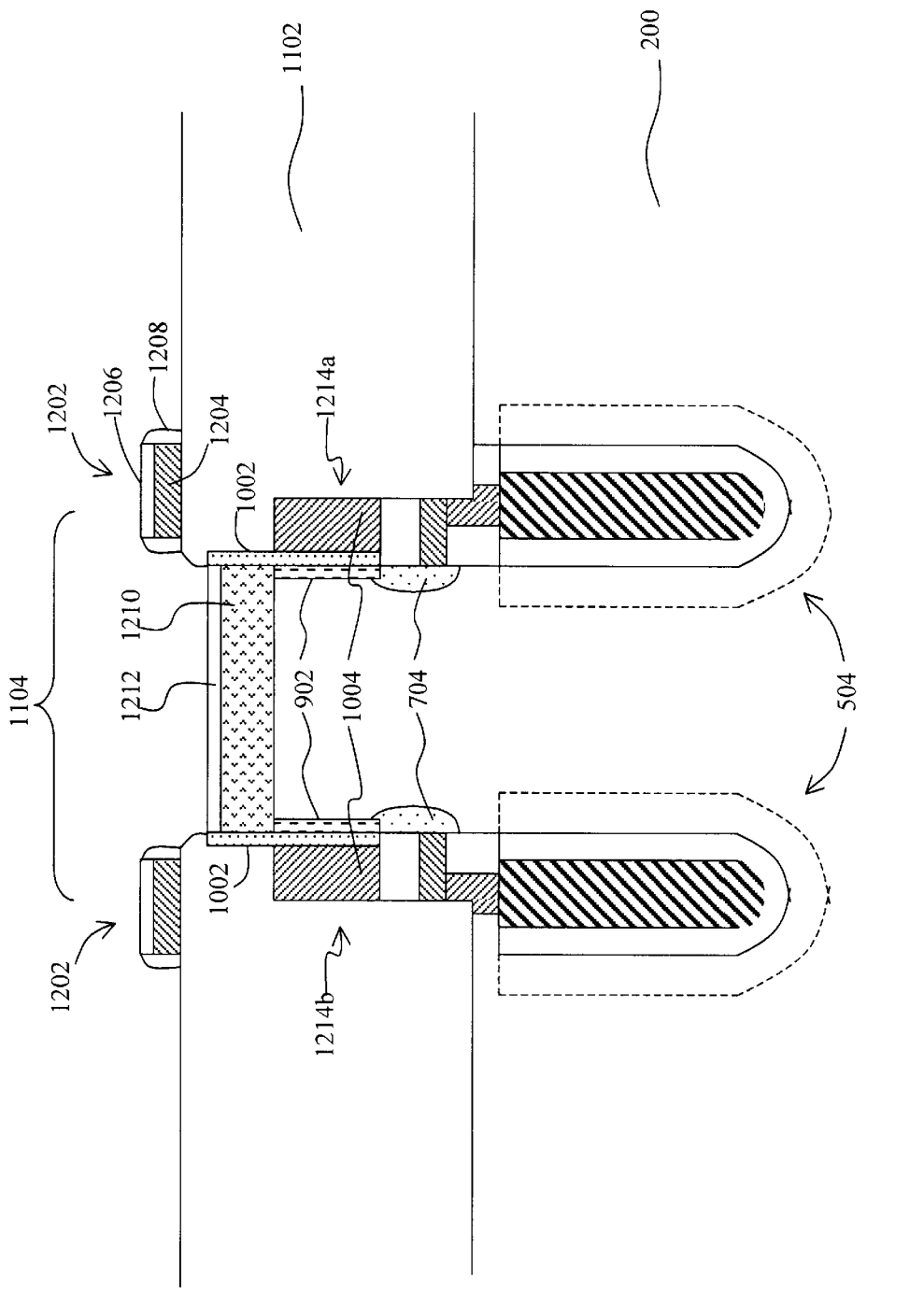
Figure 12:
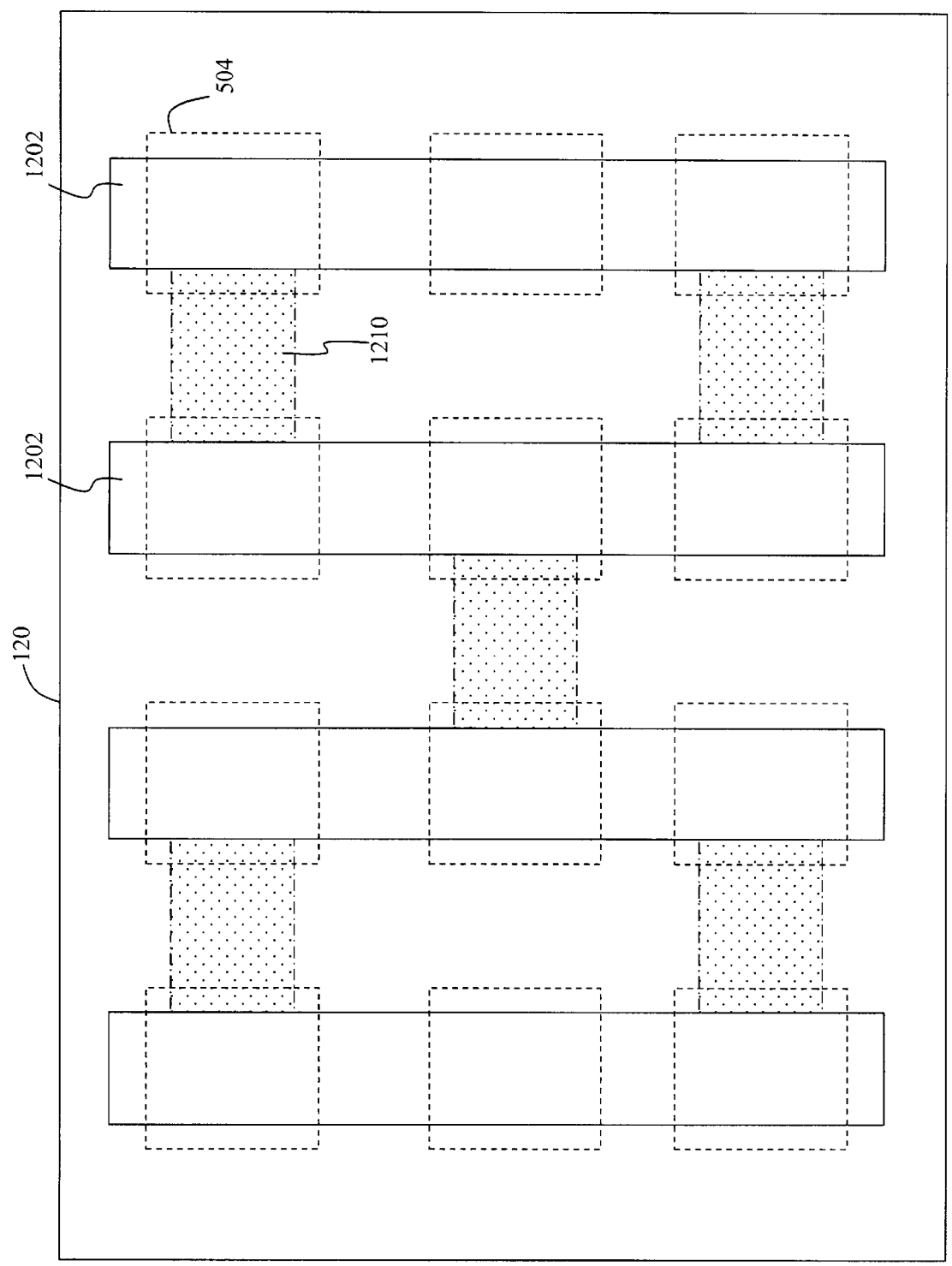

Referring to FIG. 12A, a common drain region 1210 is formed in the substrate 200. A word line 1202 is formed on the isolation layer 1102. First, the hard mask layer 204 and pad oxide layer 202 are removed, preferably by wet etching, thereby exposing the underlying substrate 200. A chemical-mechanical polishing is then applied to reduce the height of the isolation layer 1102 to about the same level as the surface of the substrate 200 that was protected under the hard mask layer 204 and the pad oxide layer 202. A sacrificial oxide layer (not shown in the figure) is grown on the exposed surface of the silicon substrate in the active region 1104.

Next, a common drain region 1210 is formed under the sacrificial oxide layer, preferably by implanting N+ dopants under the sacrificial oxide layer. The common drain region 1210 extends to the portion of the substrate 200 that is proximate to the outer perimeter of the upper sidewall of the trench 302, and touches the channel implant regon 902. When the common drain region 1210 is formed, a transistor 1214 is completed. The transistor 1214 is a vertical transistor that includes the common drain region 1210, the gate electrode 1004, the gate oxide 1002, and the source region 704. Preferably, the transistor 1214 also includes the channel implant region 902. The common drain region 1210 is shared by two adjacent transistors 1214a and 1214b in the active region 1104. Next, the sacrificial oxide layer is removed. Then a gate oxide layer 1212 is formed above the common drain region 1210, preferably using thermal oxidization method. In an alternative embodiment, an additional periphery device ion implantation is performed in the active region 1104 after the common drain region 1210 is formed. The mask pattern used for the periphery device may be different from the mask pattern used for the common drain region 1210.

Next, still referring to FIG. 12A, a word line 1202 is formed on top of the isolation layer 1102 above the capacitor 504. Preferably, a second polysilicon layer 1204 is deposited atop the isolation layer 1102. Alternatively, tungsten-silicide plus polysilicon may be used as the conducting material for the word line 1202. Next, a silicon nitride layer 1206 is deposited above the second polysilicon layer 1204. Using photolithography and etching, the second polysilicon layer 1204 and silicon nitride layer 1206 are etched to form a word line 1202 that runs in a direction perpendicular to the cross sectional plane of the figure. Next, spacers 1208 are formed beside the polysilicon layer 1204 and silicon nitride layer 1206 to provide insulation to the second polysilicon layer 1204. The spacers 1208 may be composed of SiN.

Shown in FIG. 12B is a top view of the cell array area 120 after the common drain area 1210 and the word line 1202 have been completed. The common drain area 1210 is shown as a filled dotted area. The word line 1202 runs above the capacitor 504 and the gate electrode 1004.

Figure 13:
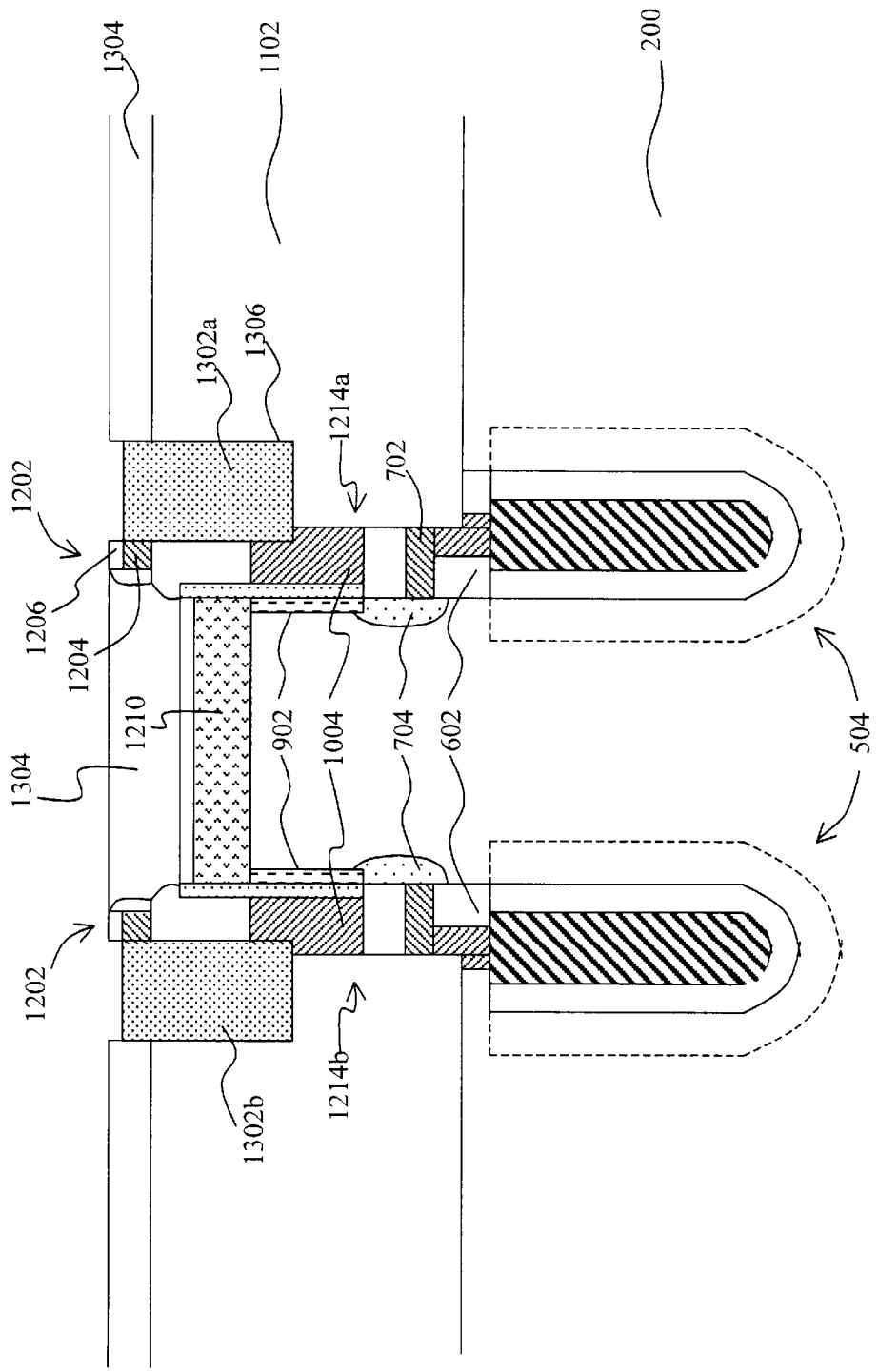
Figure 13:
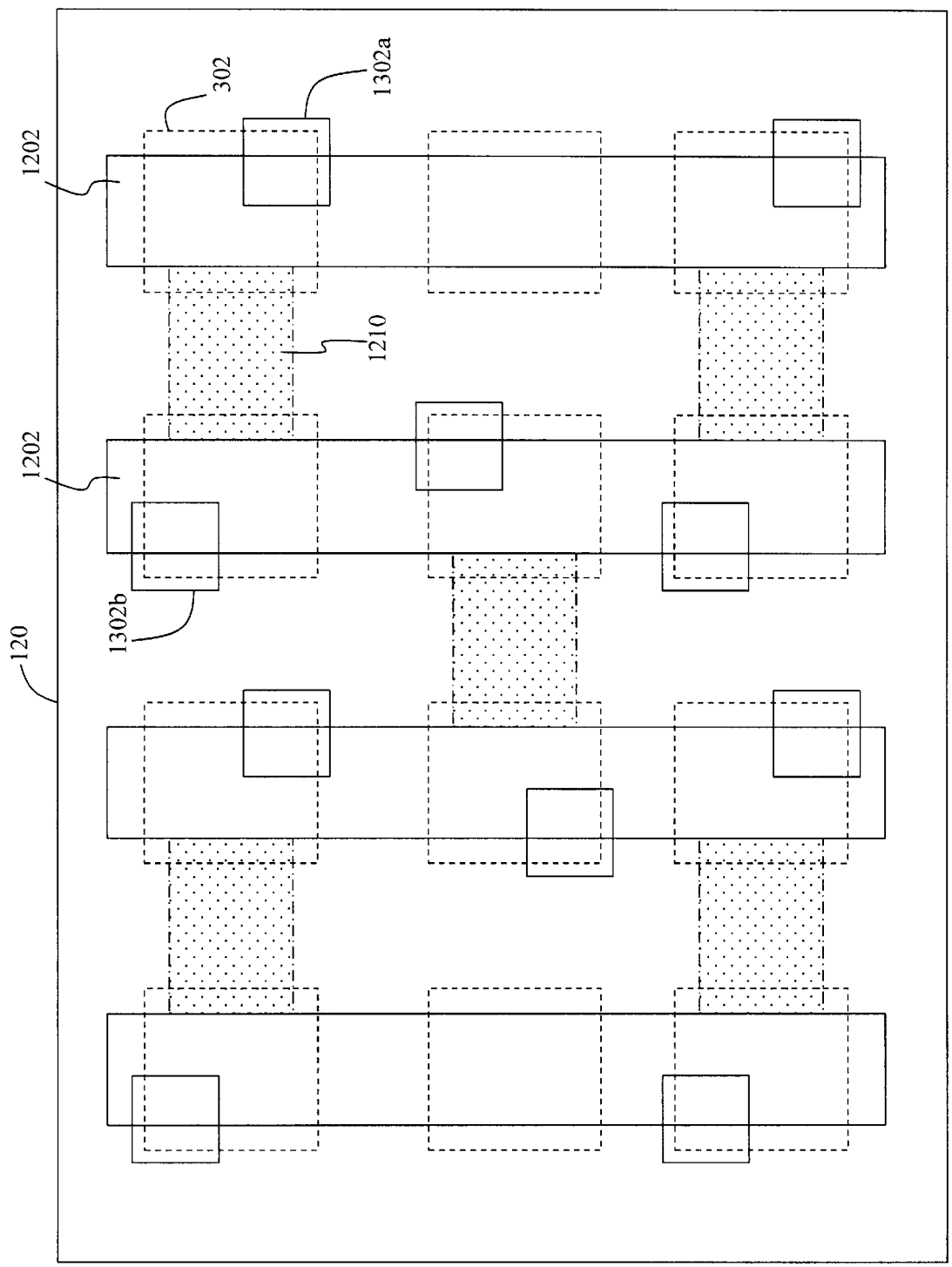

Referring to FIG. 13A, a first insulating layer 1304 is formed on top of the isolation layer 1102. A gate contact window 1302 is formed to electrically connect the word line 1202 and the gate electrode 1004. Preferably, the first insulating layer 1304 is formed by depositing a layer of BoroPhosphoSilicate Glass (BPSG) on top of the isolation layer 1102 and the word line 1202. Next, a chemical-mechanical polishing is applied to the first insulating layer 1304 to reduce its height to same level as top surface of the silicon nitride layer 1206 of the word line 1202.

Next, a gate contact opening 1306 is first formed by etching into the side of the word line 1202 and through the first insulating layer 1304 and the isolation layer 1102 at a position substantially above the capacitor 504. The gate contact opening 1306 cuts into part of the word line 1202, exposing the second polysilicon layer 1204. The depth of the gate contact opening 1306 is deep enough to expose the gate electrode 1004, but not so deep as to expose the first polysilicon layer 702. The gate contact opening 1306 is then filled with a conducting material, preferably polysilicon, thereby forming the gate contact window 1302. The gate contact window 1302 forms an electrical connection path between the word line 1202 and the gate electrode 1004. Thus, the voltage on the gate electrode 1004 will be responsive to the voltage signal applied to the word line 1202.

Shown in FIG. 13B is a top view of the cell array area 120 after the gate contact window 1302 is formed. The width of the gate contact window 1302 is smaller than the width of the trench 302. The gate contact window 1302 is above the trench 302 with a slight offset, and part of the gate contact window 1302 overlaps the word line 1202. The gate contact windows 1302a and 1302b belong to the two transistors 1214a and 1214b that share the common drain region 1210. The gate contact windows 1302a and 1302b are configured to be as far away from each other as possible to prevent signal interference. The gate contact windows of the other trench capacitors are configured in a similar manner.

Referring to FIG. 14A, a bit line 1404 and a drain contact window 1408 are formed above the common drain region 1210. First, a BPSG layer (not shown in the figure) is deposited on the wafer using chemical vapor deposition, followed by a chemical-mechanical polishing to provide planarization for the overall memory device. Then a second insulating layer 1402 is deposited on top of the BPSG layer. Preferably, the second insulating layer 1402 is composed of TetraEthylOrthoSilicate (TEOS). A drain contact opening 1406 is formed by a photolithography and etching process to etch through the second insulating layer 1402, the first insulating layer 1304, and the drain oxide layer 1212 to form an opening above the common drain region 1210. Preferably, the width of the drain contact opening 1406 proximate to the drain region 1210 is defined by the spacers of the word lines 1202a and 1202b. Such self-aligned contact provides better dimension control.

Next, a conducting layer is deposited on top of the second insulating layer 1402 and filled into the drain contact opening 1406. Preferably, the conducting layer is composed of polysilicon. Alternatively, tungsten may be used for the conducting material. The polysilicon filled within the drain contact opening 1406 becomes a drain contact window 1408. A photolithography and etching process is used etch away part of the conducting layer, and the remaining parts of the conducting layer thus become the bit line 1404. An oxide layer may be deposited above the bit line 1404 as a protection layer. The drain contact window 1408 electrically connects the bit line 1404 with the common drain region 1210.

Figure 14:
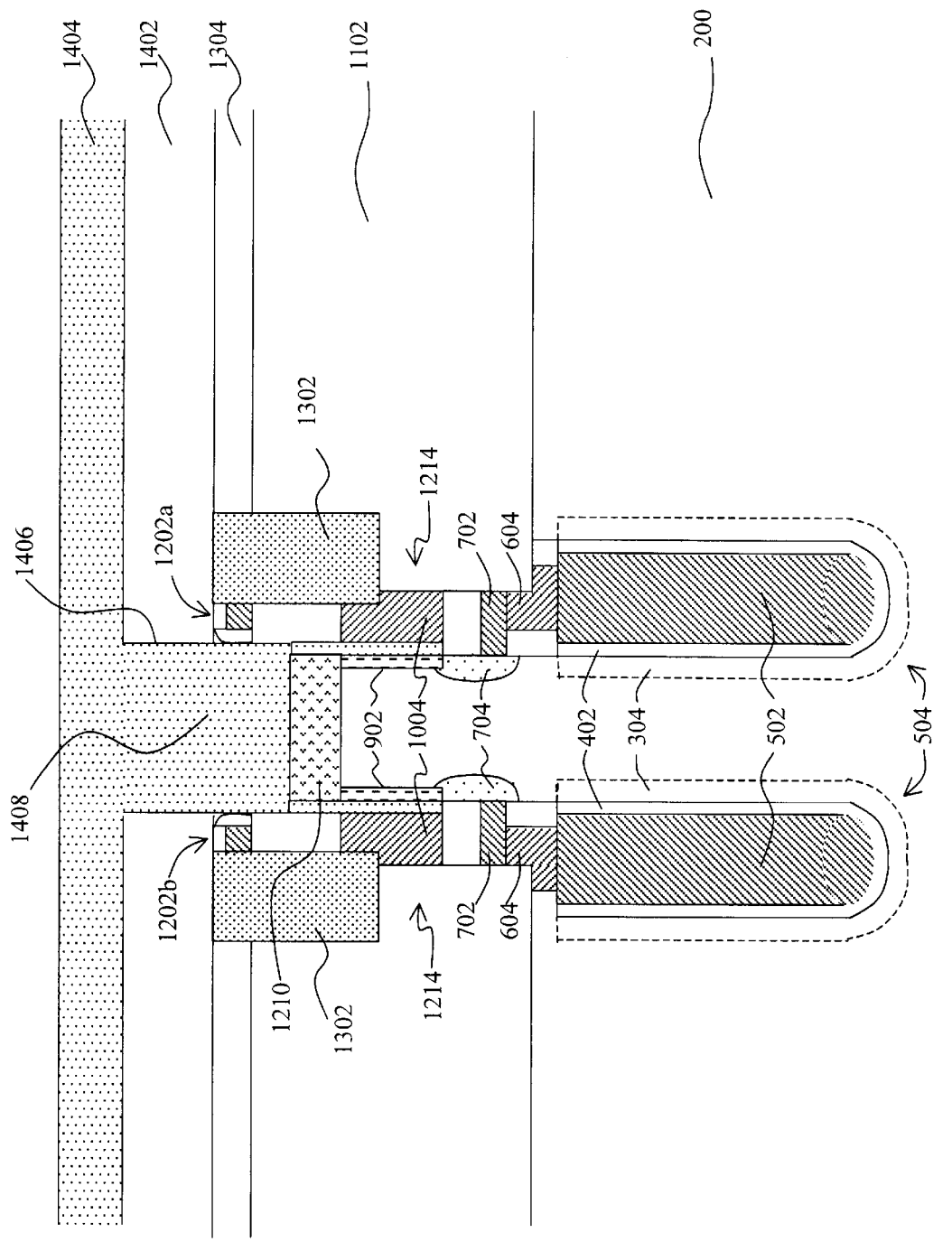
Figure 14:
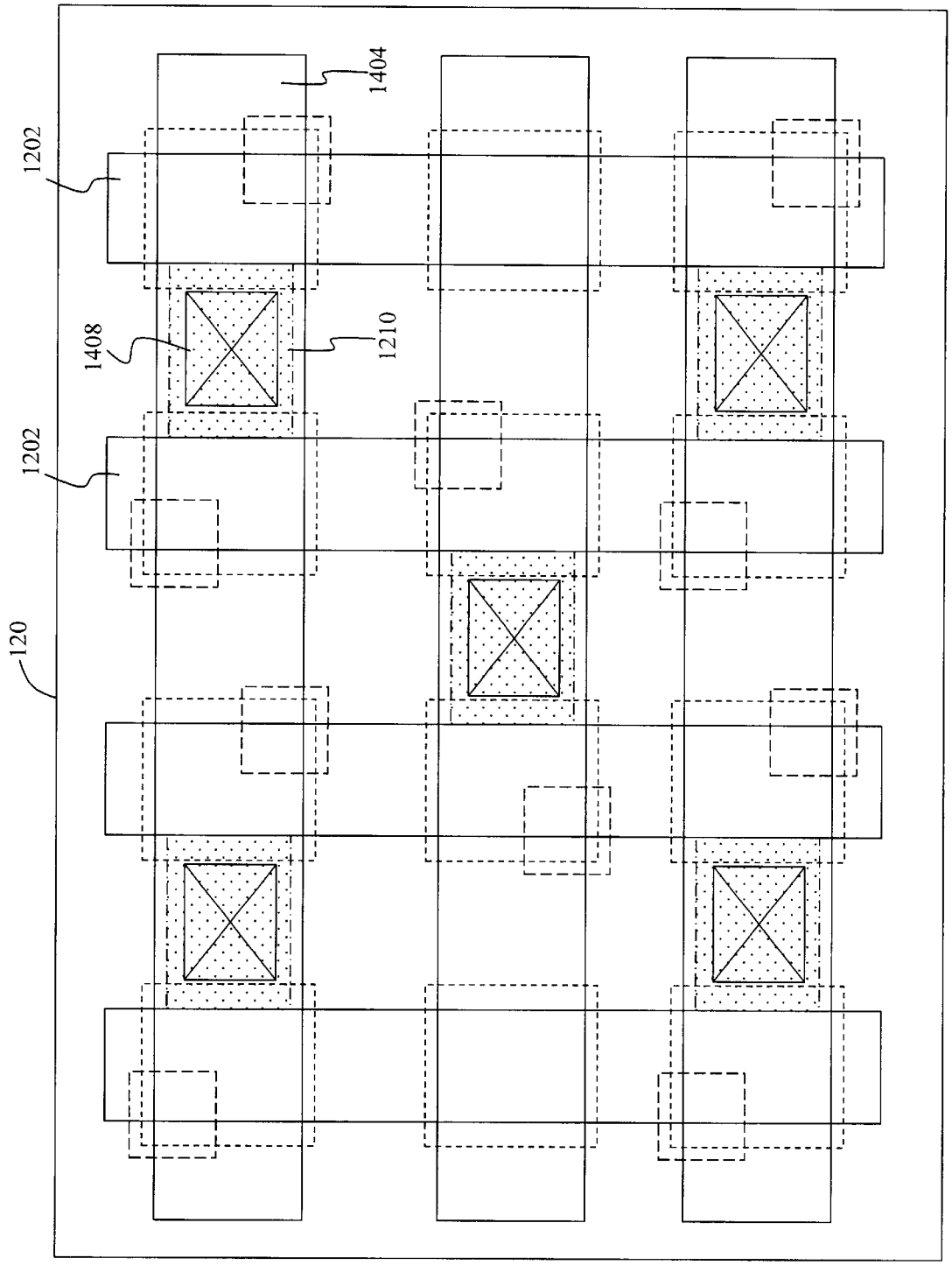

Shown in FIG. 14 B is a top view of the cell array area 120 after the bit line 1404 and the drain contact window 1408 are formed. The bit line 1404 runs above the common drain region 1210 and the drain contact window 1408.

Referring to FIG. 14A, the operation of the memory cell formed by the transistor 1214 and the capacitor 504 is described below. When a positive voltage signal is applied to the word line 1202, the voltage of the gate electrode 1004 becomes positive, and a channel is formed between the source region 704 and the common drain region 1210. The transistor 1214 is thus turned on, and the common drain region 1210 is electrically coupled to the source region 704. The source region 704 is electrically connected to the upper electrode 502 of the capacitor 504 via the first polysilicon layer 702 and the storage node connector 604. The bit line 1404 is electrically coupled to the common drain region 1210 via the drain contact window 1408. Thus, when the transistor 1214 is turned on, the bit line 1404 is electrically coupled to the capacitor 504 via the transistor 1214. Thus, a read operation can be 30 performed on the memory cell by sensing the voltage on the upper storage node 502 of the capacitor 504. Alternatively, a write operation can be performed on the memory cell by storing electric charges in the capacitor 504.

By forming a vertical transistor above a trench capacitor according to the method described in the present invention, a high-density memory cell array is achieved. While the preferred embodiment of the invention has been illustrated and described, it will be appreciated that various changes can be made therein without departing from the spirit and scope of the invention.

We claim:

1. A method for forming a memory device on a semiconductor substrate, comprising the steps of:

forming a trench in the semiconductor substrate, said trench having a lower sidewall and an upper sidewall;

forming a capacitor along said lower sidewall of said trench;

forming a source region by diffusing dopants into the outer perimeter of the lower portion of said upper sidewall of said trench;

forming a first oxide layer in the trench above said capacitor;

after forming said source region, forming a gate oxide layer on said upper sidewall of said trench;

after forming said gate oxide layer, forming a gate electrode in said trench, said gate electrode being surrounded by said gate oxide layer;

forming a drain region by diffusing dopants into the outer perimeter of the upper portion of said upper sidewalls of said trench, said drain region being above said source region and separated from said source region;

forming an isolation layer above said gate electrode;

forming a word line above said isolation layer and above said capacitor;

forming a gate contact window by etching a gate contact opening through part of said word line and through said isolation layer to expose said gate electrode, and filling said gate contact opening with a conducting material;

depositing an insulating layer above said word line;

etching a drain contact opening through said insulating layer to expose said drain region;

depositing a conducting layer above said insulating layer and filling into said drain contact opening; and etching said conducting layer to form a bit line.

2. The method of claim 1, wherein the step of forming a capacitor along the lower sidewall of said trench further comprises the steps of:

depositing dopants on said lower sidewall of said trench;

diffusing said dopants into the substrate surrounding said lower sidewall of said trench;

depositing a dielectric material on the inner perimeter of said lower sidewall of said trench; and filling the lower portion of said trench with a conducting material.

3. The method of claim 1, wherein between the step of forming a capacitor and the step of forming a source region further comprises the steps:

forming a collar insulating layer on the lower portion of said upper sidewall of said trench, said collar insulating layer situated above said capacitor; and filling the portion of said trench surrounded by said collar insulating layer with a conducting material to form a storage node connector for electrically connecting said source region to said capacitor.

4. The method of claim 3, wherein the step of forming a source region further comprises the steps:

depositing a polysilicon layer in said trench and on top of said storage node connector;

implanting dopants in said polysilicon layer; and diffusing said dopants through the sidewall of said trench surrounding said polysilicon layer by a thermal drive-in process.

5. The method of claim 1, wherein the step of forming an isolation layer above said gate electrode comprises the steps of:

providing a photomask to cover the drain region and a portion of said trench;

etching away the substrate and part of the upper sidewall of said trench to expose said gate electrode; and depositing an insulating material to form said isolation layer.

6. A method for manufacturing a memory cell of a memory device on a semiconductor substrate, said memory cell being accessed by a word line and a bit line, comprising the steps of:

forming a trench in the semiconductor substrate, said trench having a lower sidewall and an upper sidewall;

forming a capacitor along said lower sidewall of said trench;

forming a source region in the substrate adjacent to the lower portion of said upper sidewall of said trench;

forming an insulating layer in the trench above said capacitor;

after forming said source region, forming a gate insulating layer on said upper sidewall of said trench;

after forming said gate insulating layer, forming a gate electrode in said trench, said gate electrode being surrounded by said gate insulating layer;

forming a drain region in the substrate adjacent to the upper portion of said upper sidewalls of said trench, said drain region being above said source region and separated from said source region;

forming an isolation layer above said gate electrode;

forming a gate contact window that connects said gate electrode to the word line; and forming a drain contact window that connects said drain region to the bit line.

7. The method of claim 6, wherein between the step of forming a capacitor and the step of forming a source region further comprises the steps:

forming a collar insulating layer on the lower portion of said upper sidewall of said trench, said collar insulating layer situated above said capacitor; and filling the portion of said trench surrounded by said collar insulating layer with a conducting material to form a storage node connector for electrically connecting said source region to said capacitor.

8. The method of claim 6, wherein the step of forming a source region further comprises the steps:

depositing a polysilicon layer in said trench and on top of said storage node connector;

implanting dopants in said polysilicon layer; and diffusing said dopants through the sidewall of said trench and into the substrate by a thermal drive-in process.

9. The method of claim 6, wherein between the step of forming an insulating layer in the trench above said capacitor and the step of forming a gate insulating layer on said upper side-wall of said trench further comprises the step of:

forming a channel implant layer in the substrate adjacent to the upper sidewall of the trench by using directional ion implantion to implant dopants into the substrate adjacent to said upper sidewall of said trench.

\* \* \* \* \*

UNITED STATES PATENT AND TRADEMARK OFFICE
CERTIFICATE OF CORRECTION

PATENT NO.    : 6,391,705 B1
DATED         : May 21, 2002
INVENTOR(S)   : Hsiao et al.

It is certified that error appears in the above-identified patent and that said Letters Patent is hereby corrected as shown below:

Title page,
Item [54], please delete title "FABRICATION METHOD OF HIGH-DENSITY SEMICONDUCTOR MEMORY CELL STRUCTURE HAVING A TRENCH" and insert -- HIGH-DENSITY SEMICONDUCTOR MEMORY CELL STRUCTURE AND FABRICATION METHOD --.

Column 10,
Line 39, please delete "side-wall" and insert -- sidewall --.

Signed and Sealed this

Tenth Day of December, 2002

JAMES E. ROGAN
*Director of the United States Patent and Trademark Office*